(12) United States Patent
Tenno et al.

(10) Patent No.: US 12,004,290 B2
(45) Date of Patent: Jun. 4, 2024

(54) MULTILAYER BOARD

(71) Applicant: Murata Manufacturing Co., Ltd., Nagaokakyo (JP)

(72) Inventors: Nobuyuki Tenno, Nagaokakyo (JP); Nobuo Ikemoto, Nagaokakyo (JP); Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 355 days.

(21) Appl. No.: 17/514,211

(22) Filed: Oct. 29, 2021

(65) Prior Publication Data

US 2022/0053632 A1 Feb. 17, 2022

Related U.S. Application Data

(63) Continuation of application No. PCT/JP2020/023357, filed on Jun. 15, 2020.

(30) Foreign Application Priority Data

Jul. 10, 2019 (JP) .................................. 2019-128610

(51) Int. Cl.
*H05K 1/02* (2006.01)
*H01P 3/08* (2006.01)

(52) U.S. Cl.
CPC ............. *H05K 1/0237* (2013.01); *H01P 3/08* (2013.01); *H05K 1/0298* (2013.01)

(58) Field of Classification Search
CPC .... H01P 3/088; H01P 3/00; H01P 3/10; H01P 3/082

USPC ................................................. 333/204–208
See application file for complete search history.

(56) References Cited

U.S. PATENT DOCUMENTS

2009/0211792 A1 8/2009 Abrahamson et al.
2017/0187087 A1 6/2017 Baba et al.

FOREIGN PATENT DOCUMENTS

| JP | 05-291806 A | 11/1993 |
| JP | 2001-144452 A | 5/2001 |
| WO | 2016/047540 A1 | 3/2016 |

OTHER PUBLICATIONS

Official Communication issued in International Patent Application No. PCT/JP2020/023357, dated Sep. 15, 2020.

*Primary Examiner* — Rakesh B Patel
(74) *Attorney, Agent, or Firm* — Keating & Bennett, LLP

(57) ABSTRACT

In a multilayer board, a transmission line includes layers including a first insulator layer, a first joining material layer in contact with a first surface of the first insulator layer, and a second joining material layer in contact with a second surface of the first insulator layer. A signal conductor of the transmission line is on the first surface of the first insulator layer, a relative permittivity of the second joining material layer is lower than a relative permittivity of the first joining material layer, and an adhesion strength between the first insulator layer and the first joining material layer is higher than an adhesion strength between the first insulator layer and the second joining material layer.

17 Claims, 4 Drawing Sheets

MULTILAYER BOARD

CROSS REFERENCE TO RELATED APPLICATIONS

This application claims the benefit of priority to Japanese Patent Application No. 2019-128610 filed on Jul. 10, 2019 and is a Continuation Application of PCT Application No. PCT/JP2020/023357 filed on Jun. 15, 2020. The entire contents of each application are hereby incorporated herein by reference.

BACKGROUND OF THE INVENTION

1. Field of the Invention

The present invention relates to a multilayer board including a transmission line that transmits a radio frequency signal.

2. Description of the Related Art

In general, a multilayer board formed by stacking a plurality of insulator layers, which includes an insulator layer in which a conductor pattern is formed, is used, for example, as a transmission line that transmits a radio frequency signal.

For example, International Publication No. 2016/047540 describes a multilayer board formed by stacking a plurality of insulator layers that includes an insulator layer in which a signal conductor is formed and an insulator layer in which a ground conductor is formed.

A multilayer board including a transmission line, such as the one described in International Publication No. 2016/047540, is often used with the multilayer board being bent. However, in the multilayer board in which a plurality of insulator layers are stacked on top of each other with joining material layers interposed therebetween, the thickness of a joining material layer is more likely to change in a bent portion compared with a non-bent portion. Further, the signal conductor and the insulator layer may be separated at their boundary, and in that portion, a gap may be formed.

In the case where the thickness of a joining material layer changes from a predetermined thickness or a gap is formed at the boundary between the signal conductor and the insulator layer, a return loss is likely to result due to impedance mismatching in the transmission line.

SUMMARY OF THE INVENTION

Preferred embodiments of the present invention provide multilayer boards in each of which a transmission line has a highly stable electric characteristic against bending.

A multilayer board according to a preferred embodiment of the present invention includes a transmission line including a plurality of layers that are stacked and include a first insulator layer, a first joining material layer in contact with a first surface of the first insulator layer, and a second joining material layer in contact with a second surface of the first insulator layer, wherein a signal conductor of the transmission line is provided on the first surface of the first insulator layer, a relative permittivity of the second joining material layer is lower than a relative permittivity of the first joining material layer, and an adhesion strength between the first insulator layer and the first joining material layer is higher than an adhesion strength between the first insulator layer and the second joining material layer.

In general, when the multilayer board is bent in the stacking direction, the second joining material layer is likely to change in thickness due to a large stress applied thereto. However, the relative permittivity of the second joining material layer is low. Therefore, changes in a radio frequency characteristic of the transmission line caused by bending are small. Further, when the multilayer board is bent in the stacking direction, a large stress is applied to a boundary between the insulator layer and the joining material layer. However, the configuration described above makes it difficult to peel the first insulator layer from the first joining material layer or the first joining material layer from the first insulator layer, and thus a gap is unlikely to be provided in the formation layer of the signal conductor. Accordingly, changes in the radio frequency characteristic of the transmission line caused by bending are small.

According to preferred embodiments of the present invention, multilayer boards in each which a transmission line has a highly stable radio frequency characteristic against bending are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
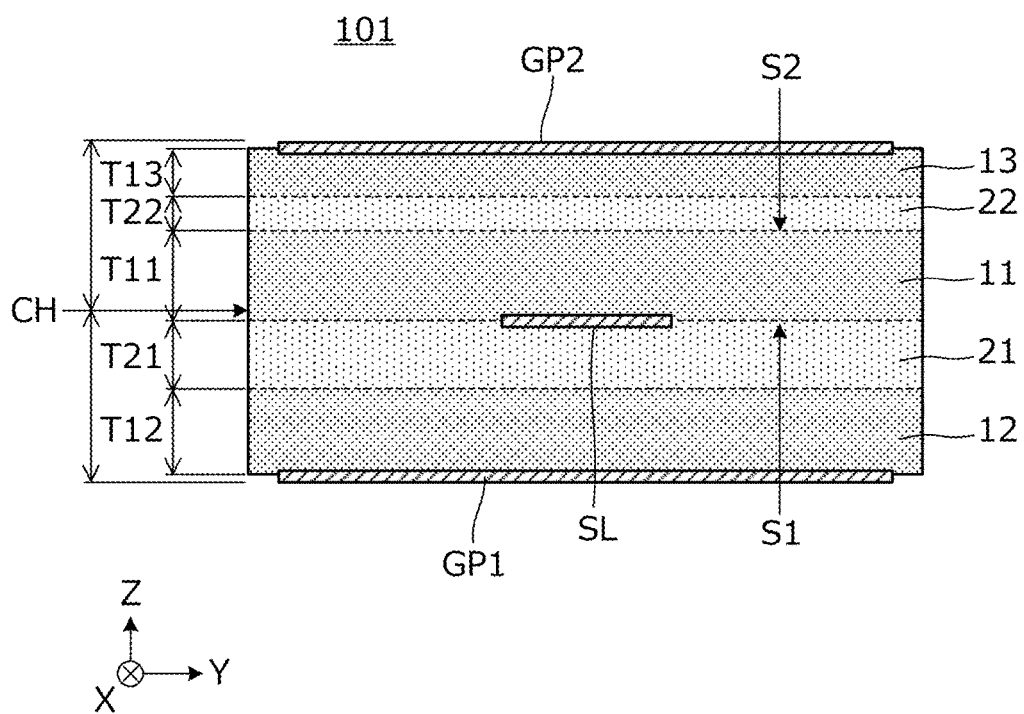
FIG. 1 is a cross-sectional view of a multilayer board 101 according to a first preferred embodiment of the present invention.

Preferred embodiments of the present invention are illustrated hereinafter with specific examples with reference to the drawings. The same reference characters designate the same or corresponding elements and portions in the drawings. In the descriptions of the second preferred embodiment and subsequent preferred embodiments, descriptions regarding matters common to the first preferred embodiment will be omitted, and points different from the first preferred embodiment will be described. Particularly, similar advantageous actions and effects caused by the same or similar elements are not repeated in every preferred embodiment.

First Preferred Embodiment

Figure 2:
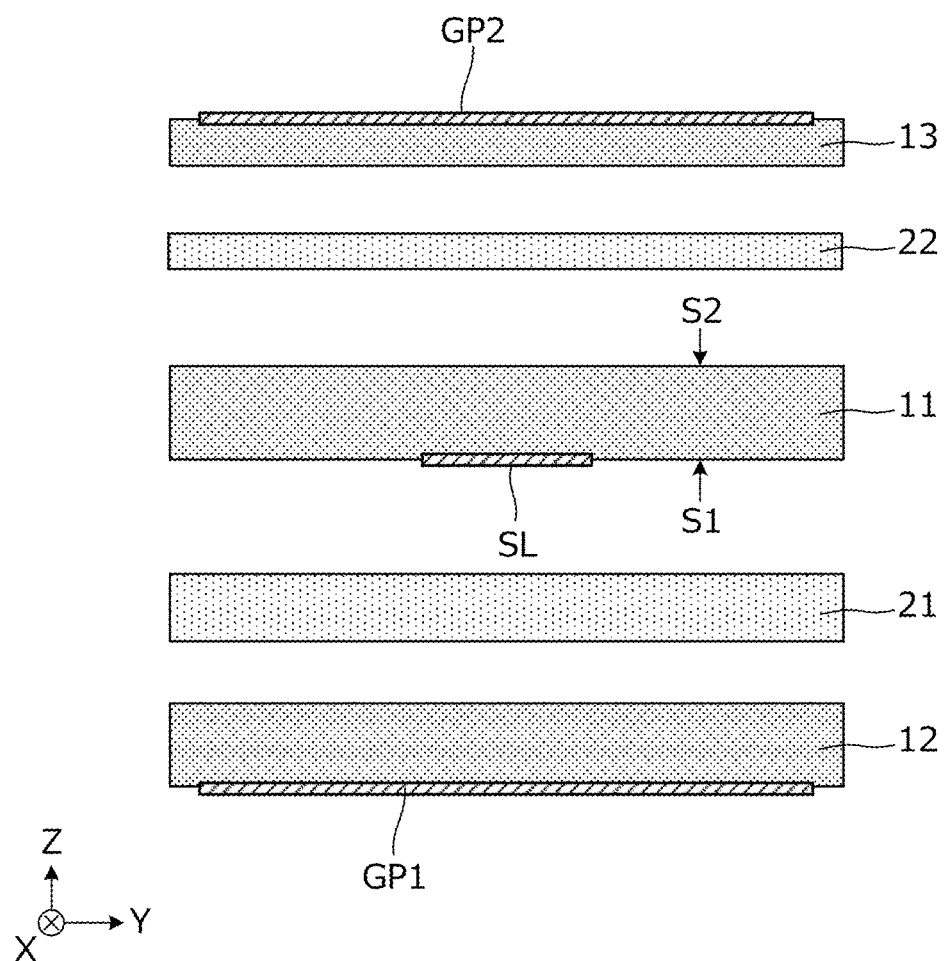
FIG. 2 is a cross-sectional view of the multilayer board 101 before stacking layers.
Figure 3:
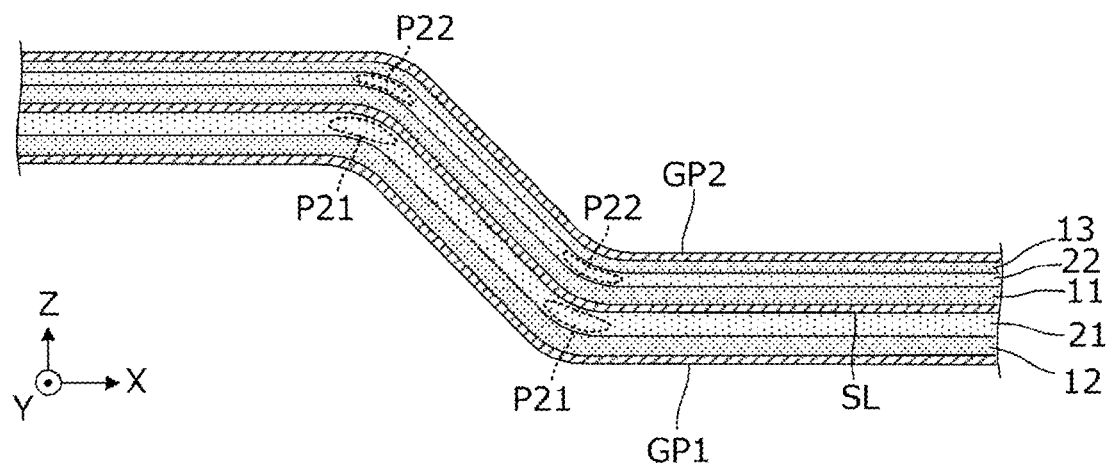
FIG. 3 is a cross-sectional view of the multilayer board 101 being bent in a stacking direction at a plane along a signal conductor SL.

FIG. 1 is a cross-sectional view of a multilayer board 101 according to a first preferred embodiment of the present invention. FIG. 2 is a cross-sectional view of the multilayer board 101 before stacking layers. FIG. 3 is a cross-sectional view of the multilayer board 101 being bent in a stacking direction at a plane along a signal conductor SL.

The multilayer board 101 includes a multilayer body including a first insulator layer 11, a second insulator layer 12, a third insulator layer 13, a first joining material layer 21, and a second joining material layer 22 stacked on top of each other in the Z-axis direction, the signal conductor SL provided in the inside of the multilayer body, and ground conductors GP1 and GP2 provided on outer surfaces of the multilayer body. The longer direction and the shorter direction of the multilayer board 101 are the X-axis direction and the Y-axis direction, respectively, and the signal conductor SL extends in the X-axis direction. The signal conductor SL, the ground conductors GP1 and GP2, the insulator layers 11, 12, and 13, and the joining material layers 21 and 22 define a stripline type transmission line. Here, the insulator layers 11, 12, and 13 and the joining material layers 21 and 22 are located between the ground conductors GP1 and GP2.

The first insulator layer 11, the second insulator layer 12, and the third insulator layer 13 are layers of resin such as, for example, polyimide, liquid crystal polymer (LCP), or the like. The first joining material layer 21 is, for example, a prepreg layer of polyimide or liquid crystal polymer (LCP), and the second joining material layer 22 is, for example, a layer of fluorine resin.

The first insulator layer 11 includes a first surface S1 and a second surface S2, which are opposite to each other, and the signal conductor SL is provided on the first surface S1 of the first insulator layer 11. The ground conductor GP1 is provided on the bottom surface of the second insulator layer 12, and the ground conductor GP2 is provided on the top surface of the third insulator layer 13. The first joining material layer 21 is in contact with the first surface S1 of the first insulator layer 11, and the second joining material layer 22 is in contact with the second surface S2 of the first insulator layer 11. Because of this configuration, the first joining material layer 21 is positioned between the signal conductor SL and the ground conductor GP1 (first ground conductor) in the Z-axis direction (stacking direction). The second joining material layer 22 is positioned between the signal conductor SL and the ground conductor GP2 (second ground conductor) in the Z-axis direction (stacking direction).

CH in FIG. 1 is a center height position of the multilayer board 101 in the stacking direction. As is evident from the center height position CH, the second joining material layer 22 is positioned closer to the surface layer in the stacking direction than is the first joining material layer 21. Further, the relative permittivity of the second joining material layer 22 is lower than the relative permittivity of the first joining material layer 21. As illustrated in FIG. 3, when the multilayer board 101 is bent in the stacking direction, a bent portion P22 of the second joining material layer 22 located in a position spaced away from the center in the stacking direction is likely to change its thickness because the bent portion P22 receives a larger stress than a bent portion P21 of the first joining material layer 21. However, because the relative permittivity of the second joining material layer 22 is low, a change in a radio frequency characteristic of the transmission line is small even when the thickness of the second joining material layer 22 changes due to bending.

Further, in the multilayer board 101 of the present preferred embodiment, the adhesion strength between the first insulator layer 11 and the first joining material layer 21 is higher than the adhesion strength between the first insulator layer 11 and the second joining material layer 22. When the multilayer board 101 is bent in the stacking direction, large stresses are applied to boundaries between the insulator layers 11, 12, and 13 and the joining material layers 21 and 22. However, the above-described configuration makes it difficult to peel the first insulator layer 11 from the first joining material layer 21 or the first joining material layer 21 from the first insulator layer 11, and thus a gap is unlikely to occur in the formation layer of the signal conductor SL. Accordingly, changes in the radio frequency characteristic of the transmission line caused by bending are small.

Further, in the multilayer board 101 of the present preferred embodiment, a Young's modulus of the second joining material layer 22 is smaller than a Young's modulus of the first joining material layer 21. That is, the second joining material layer 22 is softer than the first joining material layer 21. For example, the Young's modulus of the second joining material layer is about 0.1 GPa, and Young's modulus of the first joining material layer 21 is about 3 GPa.

As illustrated in FIG. 3, when the multilayer board 101 is bent in the stacking direction, the amount of deformation of the second joining material layer 22 which is spaced away from the center of the multilayer body is larger than the amount of deformation of the first joining material layer 21 which is closer to the center of the multilayer body. The second joining material layer 22 to which a large stress is applied is softer, and this reduces or prevents the occurrence of peel-off at the boundary between the second joining material layer 22 and the first insulator layer 11 or the boundary between the second joining material layer 22 and the third insulator layer 13. That is, the multilayer board 101 has a high mechanical structural strength against bending.

In the multilayer board 101 of the present preferred embodiment, the relative permittivity of the second joining material layer 22 is lower than relative permittivities of the first insulator layer 11 and the third insulator layer 13, and the thickness T22 of the second joining material layer 22 is thinner than the total thickness (T11+T13) of the first insulator layer 11 and the third insulator layer 13. Further, in the multilayer board 101 of the present preferred embodiment, the thickness T22 of the second joining material layer 22 is thinner than the thickness T11 of the first insulator layer 11. Further, in the multilayer board 101 of the present preferred embodiment, the thickness T22 of the second joining material layer 22 is thinner than the thickness T13 of the third insulator layer 13. Because the joining material layer is softer than the insulator layer, the thickness of the joining material layer is likely to change at the time of stacking the insulator layer and the joining material layer. However, because the second joining material layer 22, the first insulator layer 11, and the third insulator layer 13 have the above-described relationship, changes in the distance between the signal conductor SL and the ground conductor GP2 and changes in a composite relative permittivity, which are caused by changes in the thickness of the second joining material layer 22, are small. Accordingly, changes in the radio frequency characteristic of the transmission line caused by changes in the thickness of the second joining material layer 22 at the time of stacking are small.

Further, in the multilayer board 101 of the present preferred embodiment, the Young's modulus of the first joining material layer 21 is smaller than the Young's modulus of the second insulator layer 12, the relative permittivity of the first joining material layer 21 is lower than the relative permittivity of the second insulator layer 12, and the thickness T21 of the first joining material layer 21 is thinner than the thickness T12 of the second insulator layer 12. Accordingly, the thickness of the first joining material layer 21 is likely to change at the time of stacking the insulator layers and the joining material layers. However, because the first joining material layer 21 and the second insulator layer 12 have the above-described relationship, changes in the distance between the signal conductor SL and the ground conductor GP1 and changes in the composite relative permittivity thereof, which are caused by changes in the thickness of the first joining material layer 21, are small. Accordingly, changes in the radio frequency characteristic of the transmission line caused by changes in the thickness of the first joining material layer 21 at the time of stacking are small.

Second Preferred Embodiment

In a second preferred embodiment of the present invention, an example is described using a multilayer board including a plurality of signal conductors.

Figure 4:
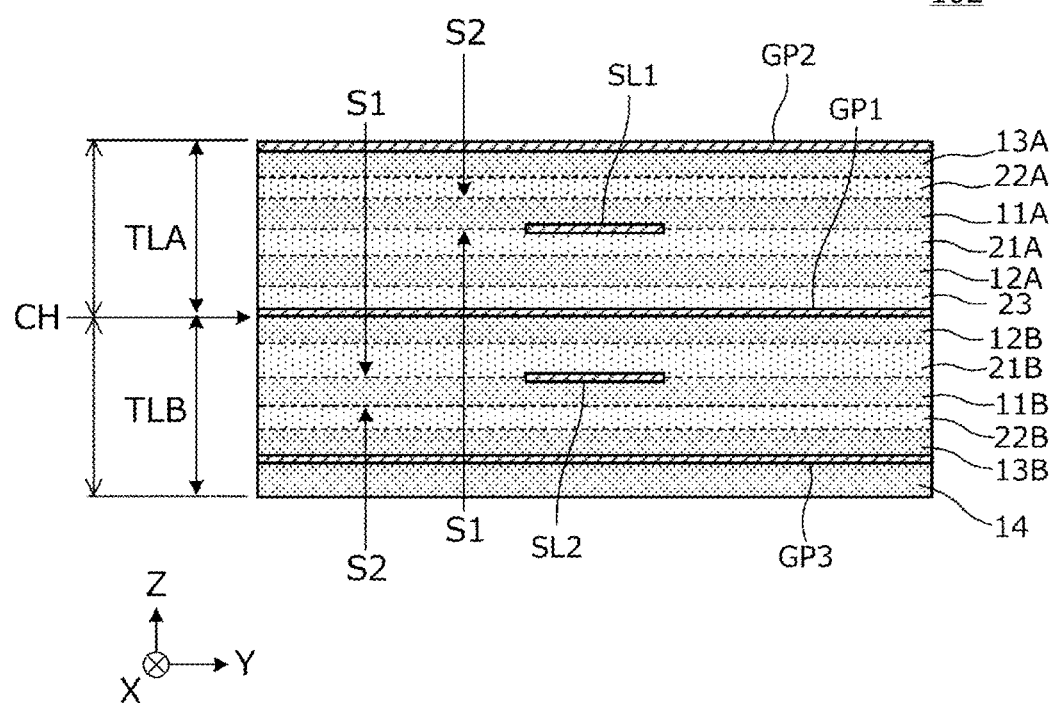
FIG. 4 is a cross-sectional view of a multilayer board 102 according to a second preferred embodiment of the present invention.

FIG. 4 is a cross-sectional view of a multilayer board 102 according to the second preferred embodiment. The longer direction and the shorter direction of the multilayer board 102 are the X-axis direction and the Y-axis direction, respectively, and the signal conductors SL1 and SL2 extend in the X-axis direction. The multilayer board 102 includes two transmission lines TLA and TLB, each of which is a stripline. The transmission line TLA includes a first insulator layer 11A, a second insulator layer 12A, a third insulator layer 13A, a first joining material layer 21, a second joining material layer 22, a joining material layer 23, the signal conductor SL1, and ground conductors GP1 and GP2. The transmission line TLB includes a first insulator layer 11B, a second insulator layer 12B, a third insulator layer 13B, a first joining material layer 21B, a second joining material layer 22B, an insulator layer 14, the signal conductor SL2, the ground conductor GP1, and a ground conductor GP3.

The first insulator layer 11A includes a first surface S1 and a second surface S2, which are opposite to each other, and the signal conductor SL1 is provided on the first surface S1 of the first insulator layer 11A. The ground conductor GP2 is provided on the top surface of the third insulator layer 13A.

The first insulator layer 11B includes a first surface S1 and a second surface S2, which are opposite to each other, and the signal conductor SL2 is provided on the first surface S1 of the first insulator layer 11B. The ground conductor GP1 is provided on the top surface of the second insulator layer 12B, and the ground conductor GP3 is provided on the bottom surface of the third insulator layer 13B or on the top surface of the insulator layer 14.

CH in FIG. 4 is a center height position of the multilayer board 102 in the stacking direction. As is evident from FIG. 4, the second joining material layer 22A is closer to the surface layer in the stacking direction than is the first joining material layer 21A. Further, the relative permittivity of the second joining material layer 22A is lower than the relative permittivity of the first joining material layer 21A. When the multilayer board 102 is bent in the stacking direction, a bent portion of the second joining material layer 22A located in a position spaced away from the center in the stacking direction is likely to change its thickness because the bent portion receives a larger stress than a bent portion of the first joining material layer 21A. However, because the relative permittivity of the second joining material layer 22A is low, changes in the radio frequency characteristic of the transmission line TLA are small even when the thickness of the second joining material layer 22A changes due to bending.

Similarly, the second joining material layer 22B is closer to the surface layer in the stacking direction than is the first joining material layer 21B. Further, the relative permittivity of the second joining material layer 22B is lower than the relative permittivity of the first joining material layer 21B. When the multilayer board 102 is bent in the stacking direction, a bent portion of the second joining material layer 22B located in a position spaced away from the center in the stacking direction is likely to change its thickness because the bent portion receives a larger stress than a bent portion of the first joining material layer 21B. However, because the relative permittivity of the second joining material layer 22B is low, changes in the radio frequency characteristic of the transmission line TLB are small even when the thickness of the second joining material layer 22B changes due to bending.

Further, in the multilayer board 102 of the present preferred embodiment, the adhesion strength between the first insulator layer 11A and the first joining material layer 21A is higher than the adhesion strength between the first insulator layer 11A and the second joining material layer 22A. The adhesive strength is a value obtained by measuring the peel strength of a fixed portion of the multilayer board. When the multilayer board 102 is bent in the stacking direction, large stresses are applied to boundaries between the insulator layers 11A, 12A, and 13A and the joining material layers 21A and 22A. However, the above-described configuration makes it difficult to peel the first insulator layer 11A from the first joining material layer 21A or the first joining material layer 21A from the first insulator layer 11A, and thus a gap is unlikely to occur in the formation layer of the signal conductor SL1. Accordingly, changes in the radio frequency characteristic of the transmission line TLA caused by bending are small.

Similarly, the adhesion strength between the first insulator layer 11B and the first joining material layer 21B is higher than the adhesion strength between the first insulator layer 11B and the second joining material layer 22B. When the multilayer board 102 is bent in the stacking direction, large stresses are applied to boundaries between the insulator layers 11B, 12B, and 13B and the joining material layers 21B and 22B. However, the above-described configuration makes it difficult to peel the first insulator layer 11B from the first joining material layer 21B or the first joining material layer 21B from the first insulator layer 11B, and thus a gap is unlikely to occur in the formation layer of the signal conductor SL2. Accordingly, changes in the radio frequency characteristic of the transmission line TLB caused by bending are small.

Further, in the multilayer board 102 of the present preferred embodiment, the Young's modulus of the second joining material layer 22A is smaller than the Young's modulus of the first joining material layer 21A. When the multilayer board 102 is bent in the stacking direction, the amount of deformation of the second joining material layer 22A which is spaced away from the center of the multilayer body is larger than the amount of deformation of the first joining material layer 21A which is closer to the center of the multilayer body. The second joining material layer 22A to which a large stress is applied is softer, and this reduces or prevents the occurrence of peel-off at the boundary between the second joining material layer 22A and the first insulator layer 11A or the boundary between the second joining material layer 22A and the third insulator layer 13A.

Similarly, the Young's modulus of the second joining material layer 22B is smaller than the Young's modulus of the first joining material layer 21B. When the multilayer board 102 is bent in the stacking direction, the amount of deformation of the second joining material layer 22B which is spaced away from the center of the multilayer body is larger than the amount of deformation of the first joining material layer 21B which is closer to the center of the multilayer body. The second joining material layer 22B to which a large stress is applied is softer, and this reduces or prevents the occurrence of peel-off at the boundary between the second joining material layer 22B and the first insulator layer 11B or the boundary between the second joining material layer 22B and the third insulator layer 13B.

Due to the above-described configuration, the multilayer board 102 has a high mechanical structural strength against bending.

Note that in the multilayer board 102 of the present preferred embodiment, the signal conductor SL1 is supported on the bottom surface of the first insulator layer 11A (closer to the center height position CH), and the signal conductor SL2 is supported on the top surface of the first insulator layer 11B (closer to the center height position CH). As described above, by arranging the signal conductors SL1 and SL2 closer to the center height position CH of the multilayer body, stresses applied to boundaries on both sides of the signal conductor SL1 and stresses applied to boundaries on both sides of the signal conductor SL2 are small when the multilayer board 102 is bent in the stacking direction. This reduces or prevents the signal conductors SL1 and SL2 from being peeled off at their boundaries and reduces or prevents changes in electrical characteristics caused by peeling off at boundary.

Third Preferred Embodiment

In a third preferred embodiment of the present invention, an example is described using a mobile electronic device 1 including a multilayer board.

Figure 5A:
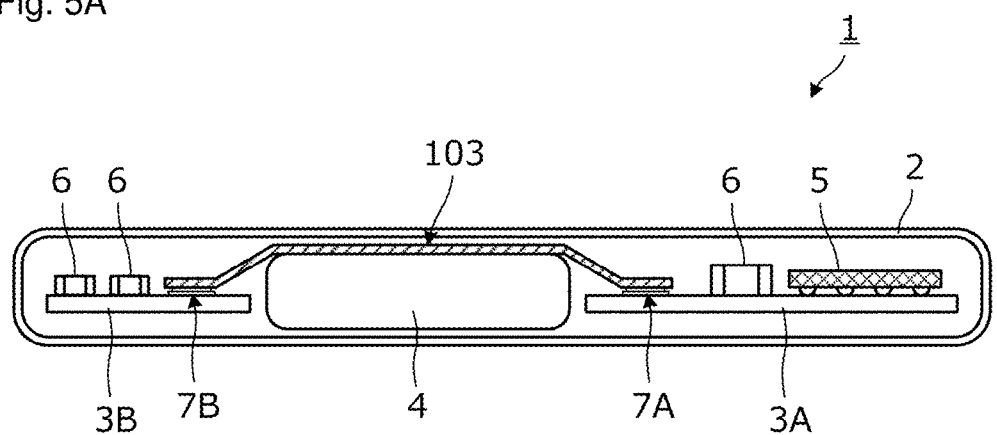
FIG. 5A is a cross-sectional view of a mobile electronic device 1 that shows a mounting state of a multilayer board 103 according to a third preferred embodiment of the present invention.
Figure 5B:
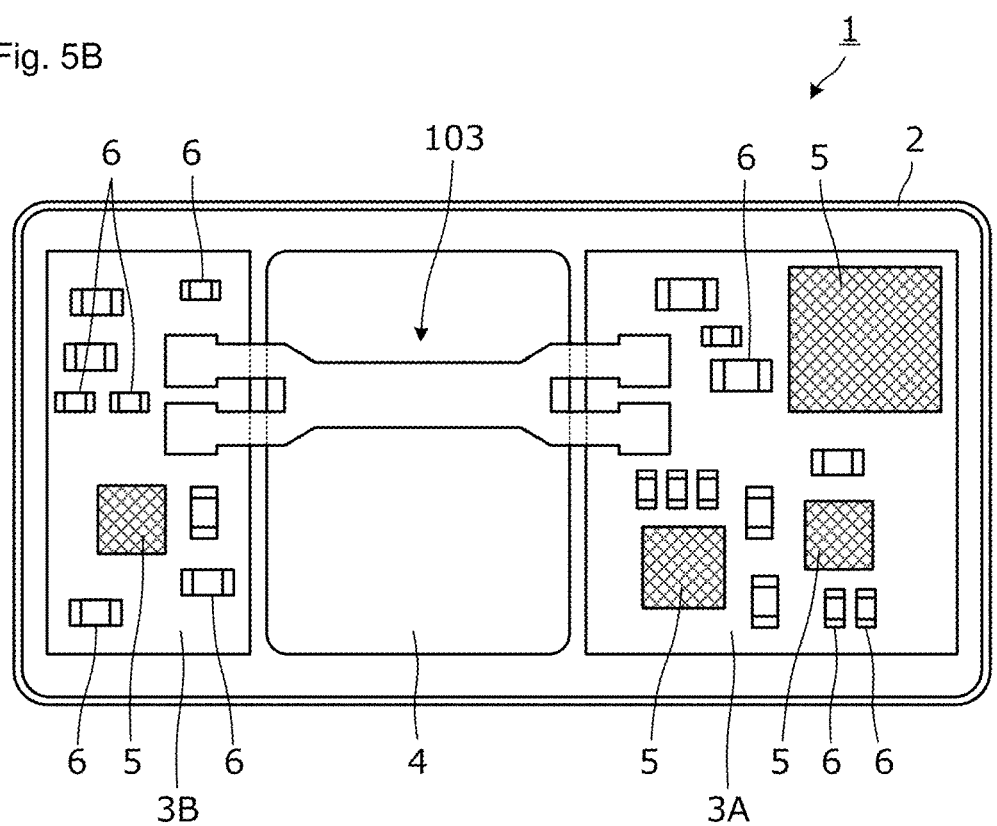
FIG. 5B is a plan view illustrating the inside of a housing of the mobile electronic device 1.

FIG. 5A is a cross-sectional view of the mobile electronic device 1 that illustrates a mounting state of a multilayer board 103 according to the third preferred embodiment, and FIG. 5B is a plan view illustrating the inside of a housing of the mobile electronic device 1.

The mobile electronic device 1 includes a low-profile housing 2. Circuit boards 3A and 3B, a battery pack 4, and the like are provided in the inside of the housing 2. A plurality of ICs 5, a plurality of chip components 6, and the like are mounted on surfaces of the circuit boards 3A and 3B. The circuit boards 3A and 3B and the battery pack 4 are installed in the housing 2 such that the battery pack 4 is between the circuit boards 3A and 3B in the plan view of the housing 2. The housing 2 is configured to have a thinnest possible shape, and thus the distance between the battery pack 4 and the housing 2 in the thickness direction of the housing 2 is extremely small.

The multilayer board 103 of the present preferred embodiment is used as a flat cable. The cross-sectional structure of the multilayer board 103 at the center is the same or substantially the same as the structure illustrated in FIG. 4 in the second preferred embodiment. That is, the multilayer board 103 is a stripline transmission line including two signal conductors. Connecting portions for electrodes 7A and 7B on the circuit boards 3A and 3B are provided on both sides of the multilayer board 103 in the longer direction.

The multilayer board 103 is provided inside of the housing 2 such that the thickness direction of the multilayer board 103 coincides with the thickness direction of the housing 2 with the multilayer board 103 being bent in the stacking direction. Because of this, it is possible to connect, via the multilayer board 103, the circuit boards 3A and 3B that are separated from each other with the battery pack 4 therebetween.

Note that a single unit of the multilayer board is illustrated in each preferred embodiment described above. However, the multilayer board may be fabricated as a collective board in which a plurality of multilayer boards are connected to each other (fabricated by a large-format process), and this collective board may be separated into individual pieces in the end.

The foregoing descriptions of the preferred embodiments are exemplary in all aspects and are not restrictive. It is evident that for a person skilled in the art, modifications and alterations are possible, if appropriate. For example, elements described in different preferred embodiments may be combined or partially exchanged. The scope of the present invention is described by the claims and not by the foregoing preferred embodiments. Furthermore, all variations which are within the meaning and range of equivalency of the claims are therefore intended to be included in the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
   a transmission line including a plurality of layers including a first insulator layer, a first joining material layer in contact with a first surface of the first insulator layer, and a second joining material layer in contact with a second surface of the first insulator layer; wherein
   a signal conductor of the transmission line is provided on the first surface of the first insulator layer;
   a relative permittivity of the second joining material layer is lower than a relative permittivity of the first joining material layer; and
   an adhesion strength between the first insulator layer and the first joining material layer is higher than an adhesion strength between the first insulator layer and the second joining material layer.

2. The multilayer board according to claim 1, wherein the second joining material layer is closer to a surface layer in a stacking direction than is the first joining material layer.

3. The multilayer board according to claim 2, wherein a Young's modulus of the second joining material layer is smaller than a Young's modulus of the first joining material layer.

4. The multilayer board according to claim 3, wherein the Young's modulus of the second joining material layer is about 0.1 GPa, and the Young's modulus of the first joining material layer is about 3 GPa.

5. The multilayer board according to claim 1, wherein
   the plurality of layers are stacked on top of one another;
   the plurality of layers include the first insulator layer, a second insulator layer, a third insulator layer, the first joining material layer between the first surface of the first insulator layer and the second insulator layer, and the second joining material layer between the second surface of the first insulator layer and the third insulator layer.

6. The multilayer board according to claim 5, wherein
   the relative permittivity of the second joining material layer is lower than relative permittivities of the first insulator layer and the third insulator layer; and
   a thickness of the second joining material layer is less than a total thickness of the first insulator layer and the third insulator layer.

7. The multilayer board according to claim 5, wherein
the relative permittivity of the second joining material layer is lower than relative permittivities of the first insulator layer and the third insulator layer; and
a thickness of the second joining material layer is less than a thickness of the first insulator layer.

8. The multilayer board according to claim 5, wherein
the relative permittivity of the second joining material layer is lower than relative permittivities of the first insulator layer and the third insulator layer; and
a thickness of the second joining material layer is less than a thickness of the third insulator layer.

9. The multilayer board according to claim 5, wherein the second and third insulating layers are made of polyimide or liquid crystal polymer.

10. The multilayer board according to claim 1, further comprising:
a first ground conductor; wherein
the first joining material layer is between the signal conductor and the first ground conductor in a stacking direction.

11. The multilayer board according to claim 1, further comprising:
a second ground conductor; wherein
the second joining material layer is between the signal conductor and the second ground conductor in a stacking direction.

12. The multilayer board according to claim 1, wherein the first insulating layer is made of polyimide or liquid crystal polymer.

13. The multilayer board according to claim 1, wherein a portion of the multilayer board is bent in a stacking direction.

14. The multilayer board according to claim 1, wherein the first joining material layer is a prepreg layer of polyimide or liquid crystal polymer.

15. The multilayer board according to claim 1, wherein the second joining material layer is made of fluorine resin.

16. The multilayer board according to claim 1, wherein
a Young's modulus of the first joining material layer is smaller than a Young's modulus of the second insulator layer;
the relative permittivity of the first joining material layer is lower than a relative permittivity of the second insulator layer; and
a thickness of the first joining material layer is less than a thickness of the second insulator layer.

17. The multilayer board according to claim 16, wherein the Young's modulus of the second joining material layer is about 0.1 GPa, and the Young's modulus of the first joining material layer is about 3 GPa.

* * * * *